United States Patent [19]
Ghoshal

[11] Patent Number: 5,952,893
[45] Date of Patent: Sep. 14, 1999

[54] INTEGRATED CIRCUIT INDUCTORS FOR USE WITH ELECTRONIC OSCILLATORS

[75] Inventor: Uttam Shyamalindu Ghoshal, Austin, Tex.

[73] Assignee: International Business Machines Corporation, Armonk, N.Y.

[21] Appl. No.: 09/036,222

[22] Filed: Mar. 6, 1998

[51] Int. Cl.⁶ .............................. H03B 5/12; H01F 27/28; H01L 29/00
[52] U.S. Cl. ............... 331/108 C; 257/531; 331/117 FE; 331/167; 336/200; 336/220
[58] Field of Search .......................... 331/117 R, 117 FE, 331/117 D, 167, 108 C, 108 D; 257/531; 336/200, 220

[56] References Cited

U.S. PATENT DOCUMENTS

| | | |
|---|---|---|
| 5,095,357 | 3/1992 | Andoh et al. ............................. 257/531 |
| 5,497,337 | 3/1996 | Ponnapalli et al. ...................... 364/489 |
| 5,656,849 | 8/1997 | Burghartz et al. ....................... 257/531 |
| 5,760,456 | 6/1998 | Grzegorek et al. ...................... 257/531 |

*Primary Examiner*—Siegfried H. Grimm
*Attorney, Agent, or Firm*—Casimer K. Salys; Andrew J. Dillon

[57] ABSTRACT

An integrated circuit having at least the following: a substrate; a composite inductor formed within the substrate having at least a first coil with an associated first coil inductance and first coil resistance and a second coil with an associated second coil inductance and second coil resistance, with the first coil formed proximate the second coil for magnetic flux linkage such that when a current in the first coil is matched with a current in the second coil, a new inductance associated with the first coil is produced that is in excess of the first coil inductance. An oscillator can be formed in the integrated circuit by connecting the first coil to at least one capacitor formed in the substrate.

17 Claims, 7 Drawing Sheets

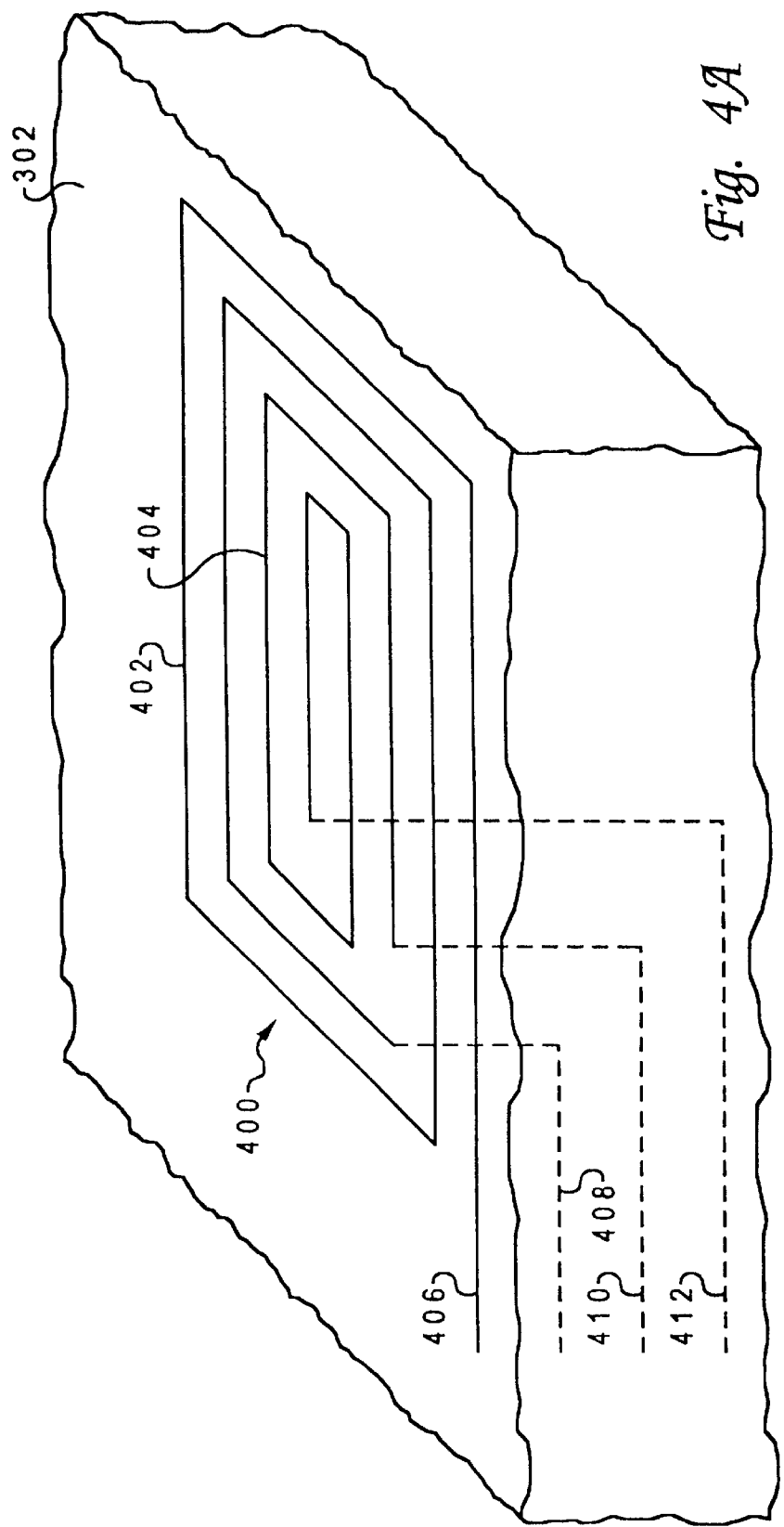

INTEGRATED CIRCUIT INDUCTORS FOR USE WITH ELECTRONIC OSCILLATORS

BACKGROUND OF THE INVENTION

1. Field of the Invention

The present invention relates, in general, to a method and apparatus for creating improved inductors capable of being operated at relatively low voltage levels and further capable of being implemented on an integrated circuit chip. Specifically, the present invention relates to a method and apparatus for creating improved inductors, capable of being operated at relatively low voltage levels and further capable of being implemented on an integrated circuit chip, and which can be adapted for use with electronic oscillators and thereby provide improved Q factors for electronic oscillators.

2. Description of Related Art

An electronic oscillator is a device or circuit that produces a periodically varying output at a controlled frequency. The electronic oscillator's output can be either voltage, current, or an electromagnetic wave.

Electronic oscillators may be either passive or active. Passive electronic oscillators are electronic circuits composed of passive electrical components. Active electronic oscillators are electronic circuits composed of at least one active electrical component, and any number of passive electrical components. Passive electrical components are those components which cannot independently generate electrical energy. Active electrical components are those components which can independently generate electrical energy.

Ideally (i.e., mathematically), electronic oscillators generate electrical energy precisely at a predefined controlled frequency. Practically (i.e., in the actual physical world), electronic oscillators generate electrical energy concentrated around a predefined controlled frequency; that is, actual (as opposed to mathematical) electronic oscillators do not generate electrical energy precisely at a predefined controlled frequency, but rather tend to generate electrical energy within a "band" of frequencies spanning some predefined controlled frequency range. This is true irrespective of whether passive or active electronic oscillators are considered.

Generally, when either passive or active electronic oscillators are actually built, the objective is to make such actual electronic oscillators approximate, as nearly as possible, their ideal mathematical equivalents. That is, an attempt is made to (1) make the "band" of frequencies spanned by the actual oscillator as narrow as possible, and (2) center that "band" of frequencies as nearly as possible about the predefined controlled centerline frequency of the ideal mathematical electronic oscillators that the actual electronic oscillator is intended to emulate.

Insofar as the objective in building an actual passive or active electronic oscillator is to approximate the actual electronic oscillator's mathematical counterpart, the "quality" of such actual electronic oscillator is assessed relative to how closely such actual electronic oscillator approximates its ideal mathematical counterpart. The "center frequency" of an actual electronic oscillator is defined to be that frequency where the output electrical power of the actual electronic oscillator is at a maximum. The usable "bandwidth" of an actual electronic oscillator is defined to be that range of frequencies, centered about the defined "center frequency," where the output electrical power has dropped to one-half the value of the maximum output electrical power (i.e., the defined "center frequency"). The "quality" of an actual electronic oscillator is described quantitatively in terms of a "Quality Factor" (Q Factor) which is defined to be the ratio of the defined "center frequency" to the defined "bandwidth." In symbols, the Q factor is typically expressed as follows: $Q=\omega_0/(\omega_2-\omega_1)$, where ($\omega_0$ stands for the "center frequency" of the oscillator, and ($\omega_2-\omega_1$) stands for the "bandwidth" of the oscillator.

With respect to actual oscillator design, then, the objective is to build an oscillator with as high a "quality," or Q Factor, as is practicable, since the higher the Q Factor, the more closely the actual oscillator approximates a mathematically ideal oscillator. As defined, the Q Factor is a mathematical formula requiring both the defined "center frequency" and the defined "bandwidth" of an actual oscillator. In practice, the "center frequency," defined "bandwidth," and thus the Q Factor of actual oscillators are assessed by use of a spectrum analyzer.

A spectrum analyzer is a device which visually depicts the electrical power of a signal distributed over a range of frequencies. In the visual display portion of a typical spectrum analyzer, such distribution of electrical power in a signal is displayed by means of a graph. The horizontal axis of the graph is marked using units of frequency, and the vertical axis of the graph is marked using units of power per unit of frequency. Using this graph, the power of an actual oscillator's output can be plotted over a range of frequencies. Typically, the power versus frequency plot for an actual oscillator will appear as a "bell shaped" curve with the apex of the "bell shaped" curve corresponding to the "center frequency," as defined above, and with the "bandwidth" consisting of that range of frequencies within which is contained one-half (½) the total power within the output of the oscillator as is represented by the area under the curve.

The better an actual oscillator is, the narrower such oscillator's "bell shaped" curve will appear on a spectrum analyzer. This is true because a higher Q factor generally connotes a smaller defined "bandwidth," which indicates that the majority of electrical energy produced by the oscillator is concentrated about the predefined controlled frequency. With respect to a spectrum analyzer, such higher Q Factors translate to narrower "bell shaped" curves, since the "bandwidth" (frequency band which contains one-half (½) the total power contained within the output of the oscillator) is narrower for higher Q Factors.

In practice, it has been found that one of the most significant factors which broadens, or spreads, the "bandwidth" of an oscillator is the time-domain "jitter" of the oscillator. The mathematically ideal oscillator, described above, produces an output waveform of some predefined controlled frequency. The frequency of a waveform is defined to be one divided by the period of time that elapses between successive wave crests of the output waveform. In the mathematically ideal oscillator the period of time between any two successive wave crests in the mathematically ideal oscillator's output waveform is always the same. Unfortunately, this is not the case with actual oscillators.

In actual oscillators, the period of time between any two successive wave crests in an actual oscillator's output waveform varies. In the context of electronic oscillators, the term utilized to describe this phenomenon of abrupt variations in the periods of an oscillator's successive output waveforms is time-domain "jitter."

This "jitter" is responsible for the "spread" of the "bell shaped" curve of an actual oscillator, as such output appears on a spectrum analyzer. That is, because each such variation in period constitutes a wave of different frequency, the power output of the oscillator will appear as spread over the range of frequencies present when such output is viewed via spectrum analyzer. The more numerous the different frequencies produced by the oscillator (i.e., the higher the time-domain "jitter"), the larger the frequency range over which the output of the oscillator is spread, and, consequently, the wider the "bandwidth," and thus the lower the Q Factor of the oscillator. Thus, from the standpoint of oscillator design it is important that such time domain "jitter" be kept as low as practicable in order to provide the best Q Factor possible within design constraints.

As can be seen from the foregoing, both "Q Factor" and time-domain "jitter" are alternate and inverse ways of describing the accuracy of an actual oscillator; that is, a high Q factor implies relatively low time-domain "jitter," and vice versa.

The accuracy required of an actual oscillator is dictated by the application in which the oscillator will be used. One type of application which requires oscillators having significant accuracy is the adaptation of electronic oscillators for use as a clock in a data-processing system.

A clock in the data-processing system is a device that generates periodic, accurately spaced signals used for various purposes such as timing, synchronization, and regulation of the operations of a data processor within the data-processing system, or the generation of interrupts. Since electronic oscillators, by definition, produce periodic accurately spaced signals, it is common to adapt them for use as clocks in data-processing systems.

Both passive and active electronic oscillators are used as clocks in data-processing systems. For data-processing systems requiring clock speeds of 200 MHZ and below, it is common to use active oscillators to provide the clock signal. Typically, such active oscillators are in the form of what are known in the art as "ring oscillators." While there are different forms of "ring oscillators," the basic form of such oscillators is that of differential-type inverters which have a gain and/or a total phase delay of a negative one-hundred-eighty (−180) degrees. As stated, such active oscillators tend to work well for clock speeds of 200 MHZ and below; however, for data-processing systems requiring clock speeds greater than 200 MHZ, such active oscillators are generally too inaccurate to provide such required clock speeds in that such active oscillators have unacceptably high levels of time-domain "jitter" and correspondingly low Q factors.

The primary sources of such unacceptably high levels of time-domain "jitter," and correspondingly low Q Factors, are inherent in the components utilized to construct such active oscillators. Under the current state of the art at least one of the primary noise sources cannot be eradicated in that it arises from thermal noise in the inverter transistors, which is a physical property inherent in the materials used to construct the inverter transistors. Furthermore, while a second primary noise source (time-domain "jitter" arising from variations in power supply voltage supplied to the active inverters) can be reduced by careful control of the power supply voltage, it cannot be eradicated and will in fact become a significant source noise at high frequencies (e.g., those frequencies starting in the 600–800 MHZ range and extending to the 1 GHz range and beyond). In addition to these two primary sources of noise, there are additional sources of noise which are also inherent in the components utilized to construct such active oscillators, such as substrate coupling in the oscillator when it is operating on a digital chip, or additional background coupling through the substrate ("ground bounce") which also cannot be eradicated due to the fact that such noise sources are inherent in the components utilized to construct such active oscillators.

Within the art, integrated circuit designs are trending toward lower and lower voltages; for example, integrated circuit designs are currently moving from 1.8 volts to 1.5 volts. This trend makes the previously-noted significant noise contributors even more significant. Present methods attempting to offset such noise contributions have included providing a special supply voltage of 2.4 volts to the oscillator itself. However, such methods begin to fail near the 600–800 MHZ range.

Attempts have been made within the art to develop other types of active oscillators which do not have the foregoing noted noise source problems. One such type of oscillator that has been developed is the surface acoustical wave (SAW) oscillator. The SAW-type oscillators tend to be very accurate, with very high Q factors. However, such SAW-type oscillators are not without practical problems. For example, (1) SAW-type oscillators generally require a two chip implementation, which can be very inconvenient in a data-processing system context; (2) the SAW-type oscillators are best tuned to frequencies within the 200–800 MHZ range, although some manufacturers are currently offering SAW-type oscillators up to 1.2 GHz; (3) SAW-type oscillators are very sensitive to temperature changes; (4) the frequency output of such SAW-type oscillators tends to vary with temperature; and (5) SAW-type oscillators typically have no tunability. Furthermore, SAW-type oscillators tend to be relatively expensive, especially in the very high frequency range.

In light of the foregoing, it is apparent that a need exists for a method and apparatus for creating an improved inductor, capable of being operated at relatively low voltage levels and further capable of being implemented on an integrated circuit chip, which can be adapted for use with an electronic oscillator and which can provide such an oscillator with a relatively high Q factor and correspondingly low time-domain "jitter."

SUMMARY OF THE INVENTION

It is therefore one object of the present invention to provide a method and apparatus for creating an improved inductor, capable of being operated at relatively low voltage levels and further capable of being implemented on an integrated circuit chip, and which can be adapted for use with an electronic oscillator.

It is therefore another object of the present invention to provide a method and apparatus for creating an improved inductor, capable of being operated at relatively low voltage levels and further capable of being implemented on an integrated circuit chip, which can be adapted for use with an electronic oscillator, and which thereby provide an improved Q factor and correspondingly low time-domain jitter for an electronic oscillator.

The objects are achieved by providing a method and apparatus for creating improved inductors which can be adapted for use with electronic oscillators. The method includes at least the following: forming a first coil in an integrated circuit substrate; forming a second coil in the integrated circuit substrate, such that the second coil is proximate to the first coil and such that a magnetic flux from the formed first coil will link with a magnetic flux of the formed second coil; connecting a first electrical source to the first coil; connecting a second electrical power source to the second coil; and energizing the first and second electrical power sources such that the currents in the first and the second coils are matched. The apparatus includes an integrated circuit having at least the following: a substrate; a composite inductor formed within the substrate having at least a first coil with an associated first coil inductance and first coil resistance and a second coil with an associated second coil inductance and second coil resistance, with the first coil and the second coil formed in the substrate such that when a current in the first coil is matched with a current in the second coil, a new inductance associated with the first coil is produced that is in excess of the first coil inductance. The apparatus can be utilized to form an oscillator implemented in an integrated circuit by placing the apparatus in electrical connection with at least one capacitor formed in the substrate such that an electronic oscillator is formed.

The above—as well as additional objects, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objects, and advantages thereof, will best be understood by reference to the following detailed description of an illustrative embodiment when read in conjunction with the accompanying drawings, wherein:

FIG. 4A shows an overhead perspective view of a spiral inductor, modified in accord with the present invention;

DETAILED DESCRIPTION OF THE INVENTION

It was mentioned in the background section that attempts have been made to produce active oscillators which operate at low voltage levels, produce very high frequency tuneable output, and have relatively high Q factors, and correspondingly low time-domain "jitter." It was explained in the background section that neither "ring" nor SAW-type oscillators are currently able to practicably achieve such low voltage levels, very high frequency tuneable outputs, and relatively high Q factors/low time-domain "jitter.".

One embodiment of the present invention achieves such low voltage levels, very high frequency tuneable outputs, and relatively high Q factor/low time-domain "jitter." However, this embodiment utilizes neither the SAW-type oscillator nor "ring" type oscillator. Rather, the embodiment is a method and apparatus which utilize a LC (inductance-capacitance) resonator.

This embodiment takes advantage of inductance and capacitance created within integrated circuits to create an oscillator which acts like a tank circuit. The embodiment produces high frequency oscillation which can be divided down to a usable frequency. The embodiment can be implemented in a CMOS (complementary metal-oxide semiconductor) integrated circuit. The embodiment provides oscillators which operate at low voltages, provide extremely high frequency ranges (including, but not limited to, frequencies extending to 2–4 GHz), have good tunability, relatively low time-domain "jitter," relatively high Q factors, and can currently be implemented in CMOS within a micro-meter area.

Figure 1:
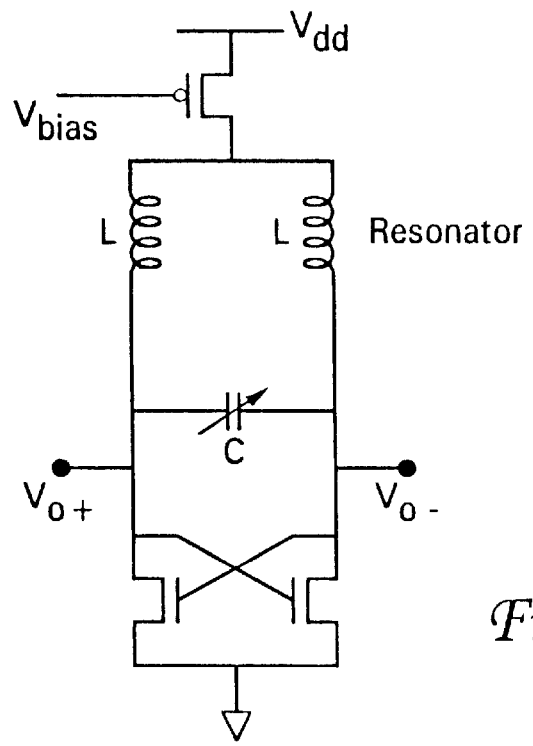
FIG. 1 shows a typical LC oscillator circuit.
Figure 2:
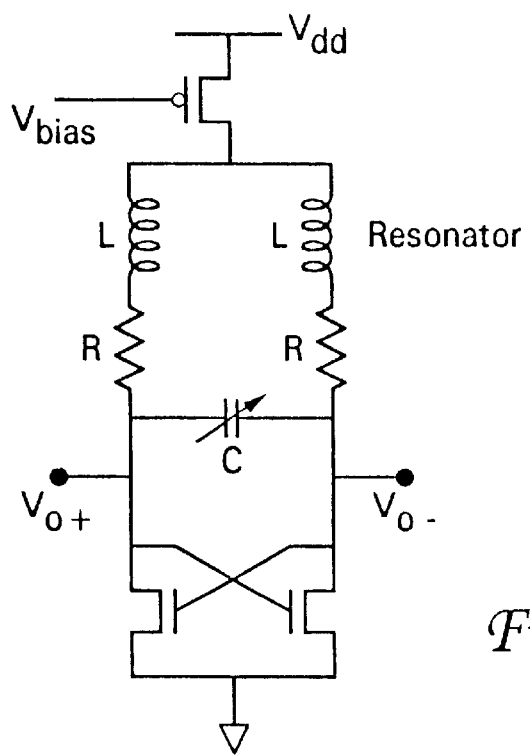
FIG. 2 illustrates an RLC structure.

Refer now to FIG. 1. FIG. 1 shows a typical LC oscillator circuit referred to in the art as a tuned oscillator, or a tuned LC oscillator, or a balanced two-phase tuned LC oscillator. It is desirable to implement the circuit shown in FIG. 1 in an integrated circuit chip. However, but for the present invention such is not practicable because when an attempt is made to implement a large inductor on an integrated circuit chip, there is typically associated with the large inductor a correspondingly large resistance appearing in series with the inductor. Thus, when the attempt is made to actually implement the LC oscillator circuit shown FIG. 1, what is achieved is actually an RLC oscillator circuit, as is shown in FIG. 2, rather than the desired LC oscillator circuit. The unintended resistance, R, has the effect of degrading the Q factor which would have been achieved had the unintended resistance not been present (that is, had only the LC components been present). It is essentially the unintended resistance, R, which makes the implementation of such passive LC oscillators circuits impracticable but for embodiments of the present invention.

As has been discussed, the objective is to the achieve an implementation of a typical LC oscillator circuit as shown in FIG. 1 in an integrated circuit chip, but without the attendant resistance as is illustrated in FIG. 2. It has been determined that a practicable approximation of the LC oscillator circuit shown in FIG. 1 can be achieved by finding a way to achieve relatively high levels of inductance, L, while keeping the resistance, R, relatively low.

It was noted in the introduction that the objective in building active oscillators is to achieve as close an approximation to mathematically ideal oscillators as is possible. Mathematically ideal oscillators have all their energy concentrated at the predefined controlled frequency (i.e., have no time-domain jitter) and thus have infinite Q factor (perfection is as good as it gets). However, for parallel resonant circuits (or, equivalently, RLC oscillators) such as that shown in FIG. 2, the mathematical formula for the Q factor of such circuits, or oscillators, is approximated by the following equation $$Q = \omega_0 * L/R \qquad (1)$$

Thus, equation 1 makes clear that in order to closely approximate a mathematically ideal oscillator, it is desirable to achieve large inductance, L, and small resistance, R. The present invention makes large L or small R possible. An embodiment where this has been achieved is set forth below. This embodiment involves producing spiral-like inductors in the single top metal plane, or in two or more planes (that is, if the chip is a multi-layer structure), where like inductors are connected in parallel.

Figure 3A:
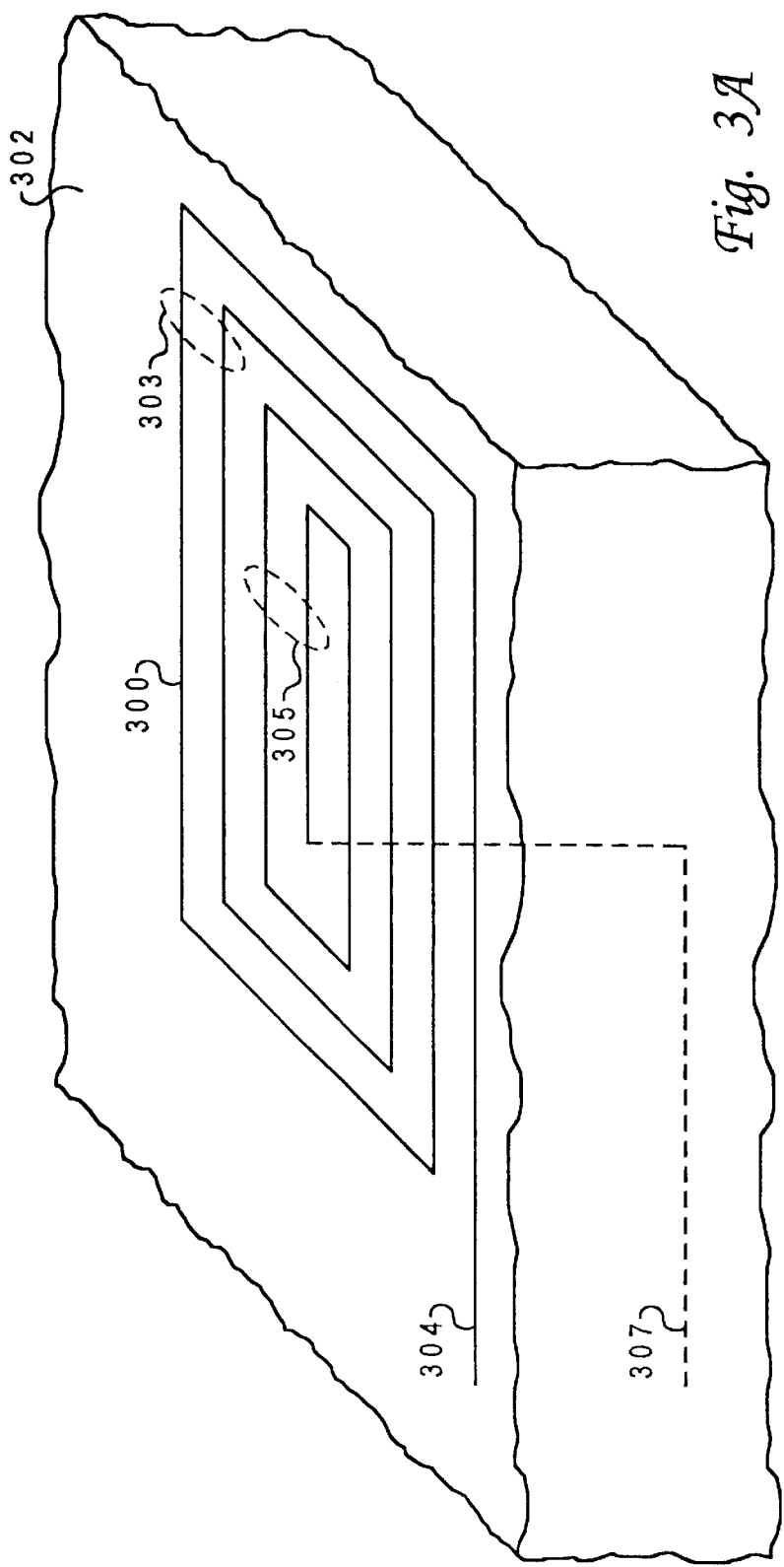
FIG. 3A illustrates a perspective drawing of a spiral inductor 300 implemented in integrated circuit substrate material 302 (e.g., CMOS)

Refer now to FIG. 3A. FIG. 3A illustrates a perspective drawing of a spiral inductor 300 implemented in integrated circuit substrate material 302 (e.g., CMOS). Shown is that spiral inductor 300 can be energized by surface line 304 and via 307 in a manner well-known in the art. Also shown in FIG. 3A is that the coils forming spiral inductor 300 can be grouped into outer spiral coils 303 and inner spiral coils 305.

Figure 3B:
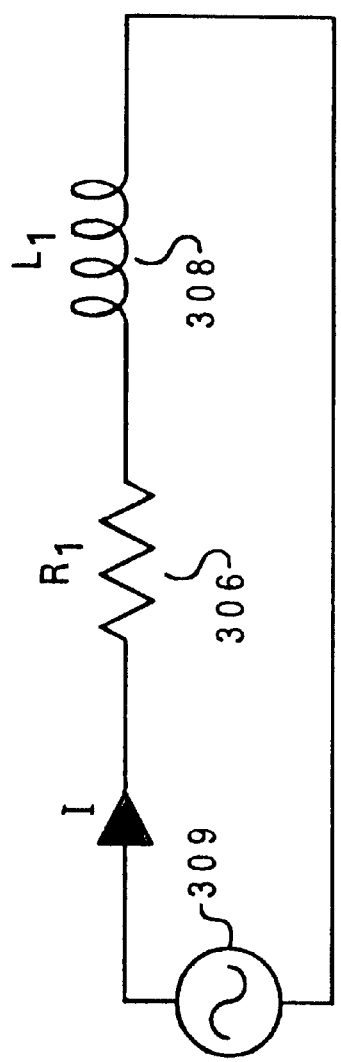
FIG. 3B shows a circuit diagram associated with the spiral inductor illustrated in FIG. 3A.
Figure 3C:
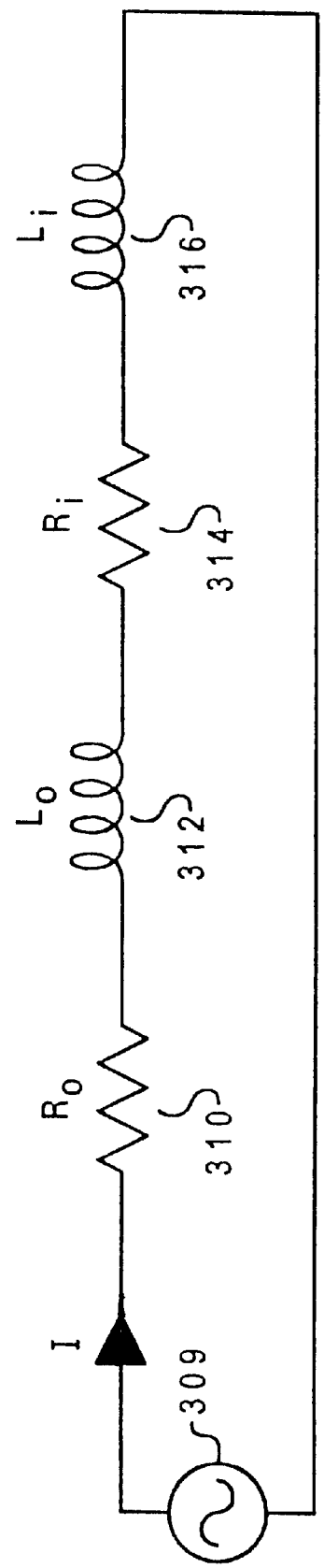
FIG. 3C shows that R1 306 and L1 308 can be conceptually separated into resistance $R_o$ 310 and inductance $L_o$ 312 associated with outer spiral coils 303, and resistance $R_i$ 314 and inductance $L_i$ 316 associated with inner spiral coils 305 (where R1 306=$R_o$ 310+$R_i$ 314, and L1 308=$L_o$ 312+$L_i$ 316)

Refer now to FIGS. 3B and 3C. FIG. 3B shows a circuit diagram associated with the spiral inductor illustrated in FIG. 3A. Shown is that the spiral inductor has resistance R1 306 and inductance L1 308 when driven by current source 309 which produces a current I of a defined magnitude and frequency. FIG. 3C shows that R1 306 and L1 308 can be conceptually separated into resistance $R_o$ 310 and inductance $L_o$ 312 associated with outer spiral coils 303, and resistance $R_i$ 314 and inductance $L_i$ 316 associated with inner spiral coils 305 (where R1 306=$R_o$ 310+$R_i$ 314, and L1 308=$L_o$ 312+$L_i$ 316).

Figure 4B:
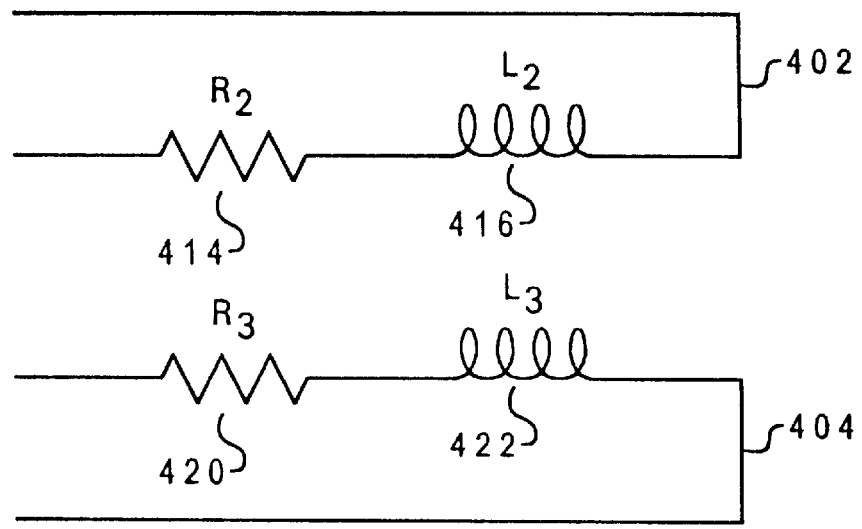
FIG. 4B illustrates a circuit diagram associated with spiral inductor 400 illustrated in FIG. 4A.

FIGS. 4A, 4B, 4C, and 4D illustrate one embodiment of the present invention that produces a new type of spiral inductor which can be utilized to produce Q factor enhancement of LC oscillators. The embodiment of FIGS. 4A, 4B, 4C, and 4D achieves this by making it possible to produce a good spiral inductor with high inductance and very low resistance. The technique by which this is done is referred to herein as "replica shielding." This technique is illustrated in FIGS. 4A and 4B.

Refer now to FIG. 4A. FIG. 4A shows an overhead perspective view of a spiral inductor, modified in accord with the present invention.

Shown in FIG. 4A is a composite spiral inductor 400 implemented in integrated substrate material 302. Composite spiral inductor 400 is composed of an outer spiral coil 402 and an inner spiral coil 404. Outer spiral coil 402 and inner spiral coil 404 are geometrically arranged in the same plane such that they closely approximate outer spiral coils 303 and inner spiral coils 305 of spiral coil inductor 300, which appears as a one-piece coil in FIG. 3A. Shown is that outer spiral coil 402 can be energized by surface line 406 and via 408. Further shown is that inner coil 404 can be energized by via 410 and via 412.

FIG. 4B illustrates a circuit diagram associated with composite spiral inductor 400 illustrated in FIG. 4A. Shown is that outer spiral coil 402 has resistance R2 414 and inductance L2 416 when driven by a current source operating at some defined magnitude and frequency. Also shown is that inner spiral coil 404 has resistance R3 420 and inductance L3 422 when driven by a current source operating at some defined magnitude and frequency. It has been found that the structure of composite inductor 400 can be used to produce an inductor with relatively high inductance, L, and relatively low resistance, R, which can be utilized to provide an oscillator with high Q factor.

Figure 4D:
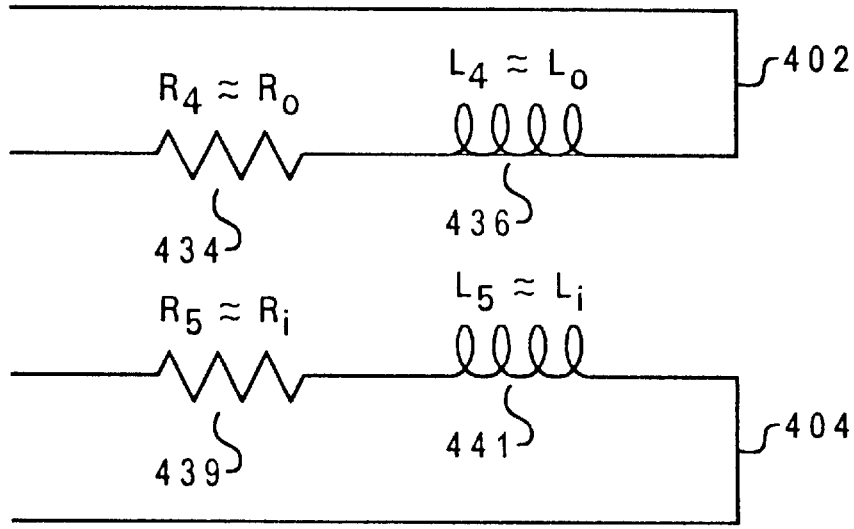
FIG. 4D shows a circuit diagram of the circuit shown in FIG. 4C.
Figure 4C:
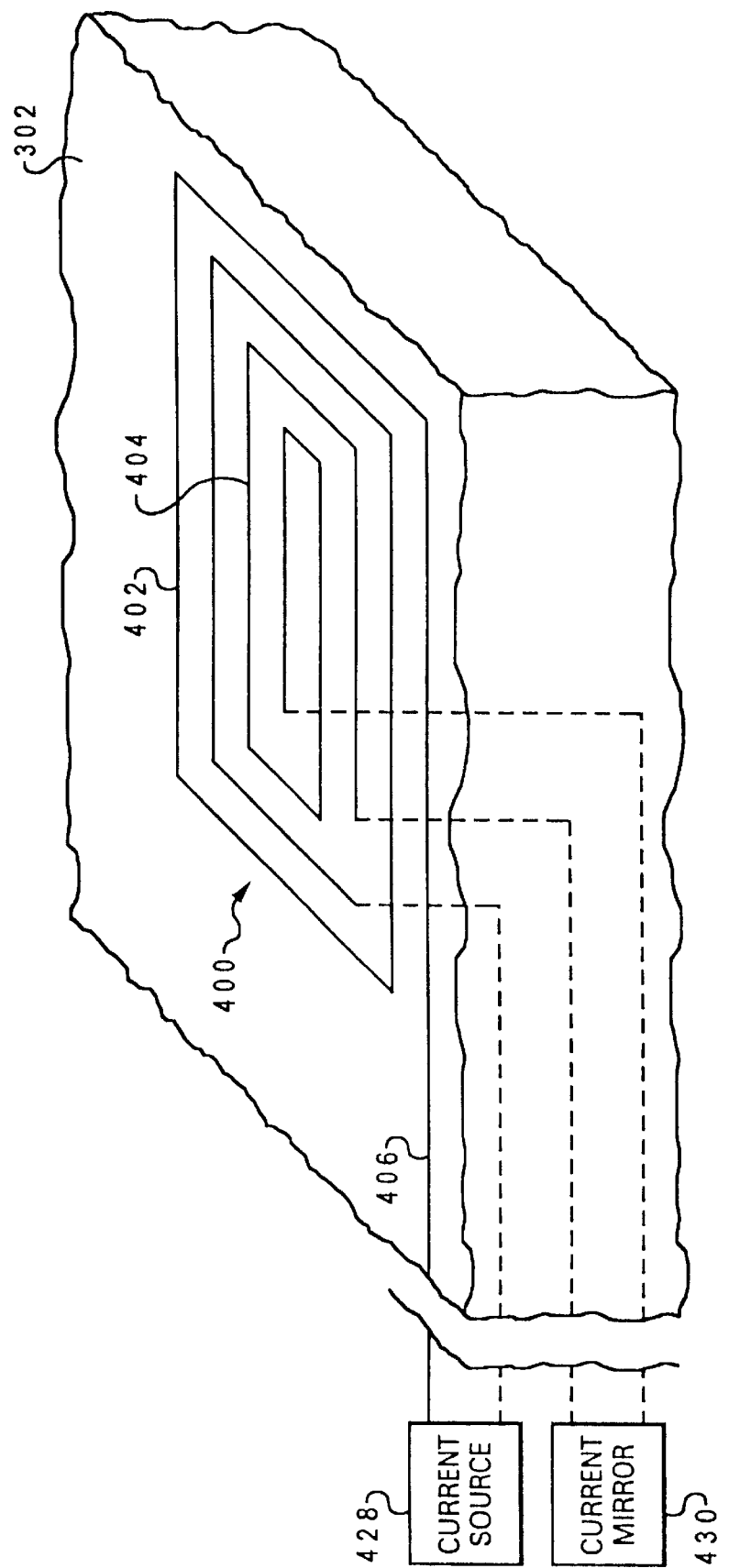
FIG. 4C shows how outer spiral coil 402 and inner spiral coil 404 can be energized to create an inductor with relatively high inductance, L, and relatively low resistance, R, which can be utilized to provide an oscillator with high Q factor.

Shown in FIG. 4C is how outer spiral coil 402 and inner spiral coil 404 can be energized to create an inductor with relatively high inductance, L, and relatively low resistance, R, which can be utilized to provide an oscillator with high Q factor. Shown is that outer spiral coil 402 is driven by electrical current source 428 which produces a current $I_o$ and that inner spiral coil 404 is driven by current mirror 430 which produces a current $I_i$.

Current mirror 430 is an electrical source which mimics electrical current source 428 (it has been found that in a preferred embodiment a crucial factor in such mimicking is to ensure that (1) the direction and phase of $I_i$ mimics as nearly as is practicable the direction and phase of current $I_o$ and that (2) the magnitude of $I_i$ be greater than or equal to the magnitude of $I_o$). That is, in a preferred embodiment inner spiral coil 404 is driven by current $I_i$ at least the same magnitude as and in phase with current $I_o$ driving outer spiral coil 402.

Assume for sake of illustration that the magnitude, phase, and direction of currents I, $I_o$, and $I_i$ have all been made equivalent. Thus, it can be seen that the idea of matching the magnitude, direction, and phase of the currents in outer spiral coil 402 and inner spiral coil 404 is to closely approximate current I in the correspondent outer spiral coils 303 and inner spiral coils 305 of one-piece spiral coil 300 driven by current source 309. This is a key point, in that it means that from a magnetic flux standpoint, the magnetic flux linkage between outer spiral coil 402 and inner spiral coil 404 links to create an effective inductance for outer spiral coil numeral 402 approximately equal to outer spiral coil inductance $L_o$ 312 associated with outer spiral coils 303, and an effective inductance for inner spiral coil 404 approximately equal to inner spiral coil inductance $L_i$ 316 associated with inner spiral coils 305. Furthermore, if it is assumed that the number of coils in outer spiral coils 303, inner spiral coils 305, outer spiral coil 402, and inner spiral coil 404 are equal then it can be seen that $L_o$ 312 will be roughly equal to $L_i$ 316, and thus that the correspondent inductance of outer spiral coil 402 and inner spiral coil 404 are roughly equal.

Those skilled in the art will recognize that when one-piece spiral inductor 300 is driven with an electric current I the magnetic field at the center of one-piece spiral inductor 300 will be very high because every spiral is coupling magnetic field into the center region. When the magnetic field is high the local current density in the inner turns of one-piece spiral inductor 300 will also be very high. The current will tend to crowd in the center windings within the wire cross-section. This resistance results from the interaction of the current and the magnetic field. Further from the center, the current density in each wire will become more uniform. Thus, the inner spiral coils resistance $R_i$ 314 contributes much larger resistance in comparison to the resistance contributed by outer spiral coils resistance $R_o$ 310 of one-piece spiral inductor 300.

Because current sources 428 and 430 have been adjusted such that the electromagnetic environment of composite spiral inductor 400 closely approximates that of one-piece spiral inductor 300 being driven by current source 309, the effective resistance for outer spiral coil 402 is approximately equal to outer spiral coil resistance $R_o$ 310 associated with outer spiral coil 303, and an effective resistance for inner spiral coil 404 is approximately equal to inner spiral coil resistance $R_i$ 314 associated with inner spiral coil 305. Thus, inner spiral coil resistance $R_i$ 314 will tend to be much, much greater than outer spiral coil resistance $R_o$ 310.

The utility of the foregoing is that it gives rise to an increase in inductance in outer spiral 402 without a concomitant increase in resistance. Those skilled in the art will recognize that it is possible to alleviate some of these resistive losses described for spiral inductors by increasing the space between spirals, but this tends to make the coil too wide to be of effective use in an integrated circuit environment as the number of turns increase for higher inductance. Furthermore, those skilled in the art will recognize that as the number of turns increase, the substrate losses increase because they are volume related. This tends to place an upper bound on the size of one-piece spiral inductor 300. There is thus a practical upper and lower bound on the size of one-piece inductor 300. It has been determined that the lower bound is mainly affected by current crowding within the inner coils. The structure shown in FIG. 4C has given rise to a way to create an inductor which will approach the inductance of a one-piece inductor of a similar number of turns, but without the resistance associated with the inner turns of such a one-piece inductor.

As will be shown below, the structure of composite spiral inductor 400 can be used to achieve an oscillator with higher Q than that without such an embodiment of the present invention. Why this is true can be seen by reference to equation 1. As shown in equation 1, the Q of an oscillator is directly dependent upon the ratio of L/R (inductance to resistance). For one-piece spiral inductor 300 operating as has been described above, this ratio can be written $$(L/R)_{one\text{-}piece\ inductor} = ((L1\ 308)/((R1\ 306))$$

or, in terms of values associated with outer spiral coils 303 and inner spiral coils 305, $$(L/R)_{one\text{-}piece\ inductor} = ((L_o\ 312 + L_i\ 316)/((R_o\ 310 + R_i\ 314)).$$

Furthermore, since in the case discussed above $L_o$ 312 is roughly equal to $L_i$ 316, $(L/R)_{one\text{-}piece\ inductor}$ can be written as $$(L/R)_{one\text{-}piece\ inductor} = ((2L_o\ 312)/((R_o\ 310 + R_i\ 314)).$$

Utilizing outer coil 402 as the oscillator coil in the fashion described below in FIGS. 5A and 5B, the L/R ratio for such an oscillator can be written $$(L/R)_{outer\text{-}coil\ inductor} = ((L_o\ 312)/((R_o\ 310)),$$

or, equivalently, $$(L/R)_{outer\text{-}coil\ inductor} = ((2L_o\ 312)/((R_o\ 310 + R_o\ 310)).$$

It has been discussed that $R_i$ 314 will always be greater than $R_o$ 310. Thus, comparison of $(L/R)_{one\text{-}piece\ inductor}$ with $(L/R)_{outer\text{-}coil\ inductor}$ reveals that $(L/R)_{outer\text{-}coil\ inductor}$ will always be greater than $(L/R)_{one\text{-}piece\ inductor}$. Thus, since $Q = \omega_0 * L/R$, the Q for an oscillator utilizing as its inductive element outer-coil 402 of composite inductor 400 inductor being operated as described in relation to FIG. 4C, will always be greater than the Q of an oscillator utilizing as its inductive element one-piece inductor 300.

Refer now to FIG. 4D. FIG. 4D shows a circuit diagram of the circuit shown in FIG. 4C. Shown is that outer spiral coil 402 has effective resistance R4 434 approximately equal to resistance outer spiral coils resistance $R_o$ 310 and inductance L4 436 approximately equal to outer spiral coils inductance $L_o$ 312. Also shown is that inner spiral coil 404 has resistance R5 439 approximately equal to inner spiral coils resistance $R_i$ 314 and inductance L5 441 approximately equal to inner spiral coils inductance $L_i$ 316.

With the help of FIG. 4D, it can be seen that the configuration shown in FIG. 4C concentrates most the resistance of one-piece spiral inductor 300 into resistance R5 439 of the inner spiral coil 404, while leaving resistance R4 434 of outer spiral coil 402 relatively low. That is, in the structure shown in FIG. 4C the majority of the losses are built into inner coil 404, by use of the "replica circuit" composed of inner coil 404 driven by current mirror 428. Inner coil 404 will not be part of the oscillator inductance.

Figure 5A:
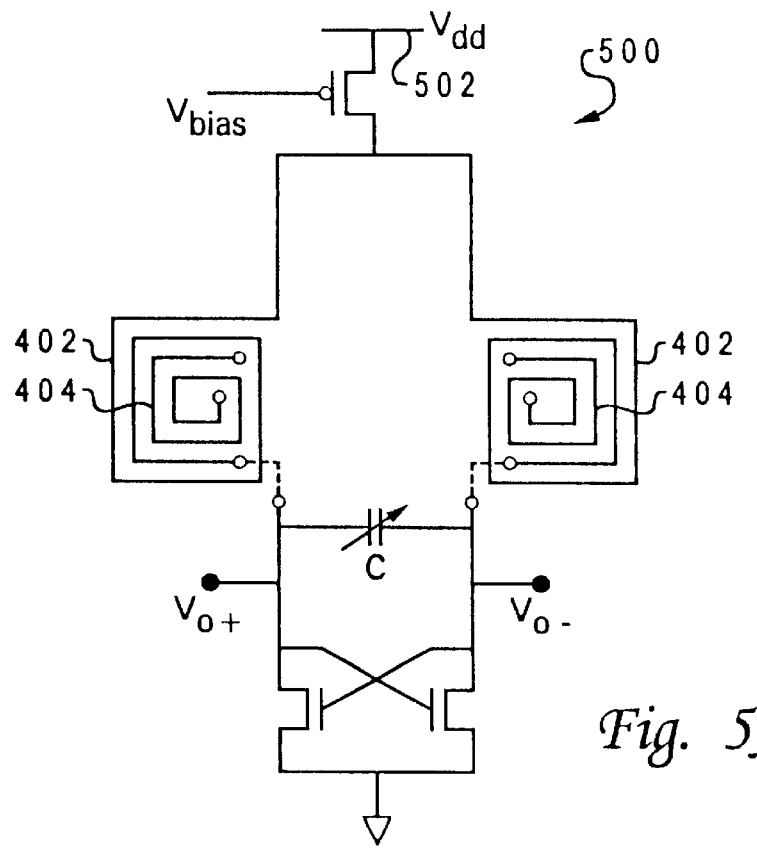
FIG. 5A depicts a partially schematic quasi-circuit diagram which shows how the embodiment set forth in FIGS. 4A–4D can be utilized to provide an improved LC oscillator.

Refer now to FIG. 5A. FIG. 5A depicts a partially schematic quasi-circuit diagram which shows how the embodiment set forth in FIGS. 4A–4D can be utilized to provide an improved LC oscillator. Shown in FIG. 5A is LC oscillator 500. LC oscillator 500 is essentially the oscillator shown in FIG. 2, but with the resistive inductive elements of the oscillator of FIG. 2 replaced with the embodiment set forth in FIG. 4C.

In FIG. 5A, outer coil 402 and inner coil 404 are shown in plan view. Oscillator current is supplied from source $V_{dd}$ 502 which serves to supply current to outer spiral coils 402 in a fashion analogous to that of current source 428 described earlier, which only directly feeds outer spiral coils 402. A current mirror source (not shown), serves to supply current to inner spiral coils 404 oscillator current sources 428 in a fashion analogous to that of current source 428 described earlier. The current mirror source is used to drive inner spiral coils 404 such that the current in each inner spiral coil 404 is of greater than or equal magnitude, in the same direction as, and in phase with the current in its correspondent outer spiral coil 402. The rest of LC oscillator 500 is as was illustrated in FIG. 2.

Those skilled in the art will recognize that there are many ways to configure a mirror current source such that the currents in an inner coil 404-outer coil 402 pair are such that the current in inner coil 404 is of greater than or equal magnitude, in the same direction as, and in phase with the current in outer coil 402. One such way is to use a quadrature oscillator and current sources controlled by quadrature phases to produce currents such that currents in each inner and outer coil pair will match in phase, such as that disclosed in pending application Ser. No. 09/013,280, Apparatus and Method for Frequency Tuning a LC Oscillator In a Integrated Circuit, filed in the USPTO Jan. 26 1998, which is hereby incorporated by reference in its entirety.

Figure 5B:
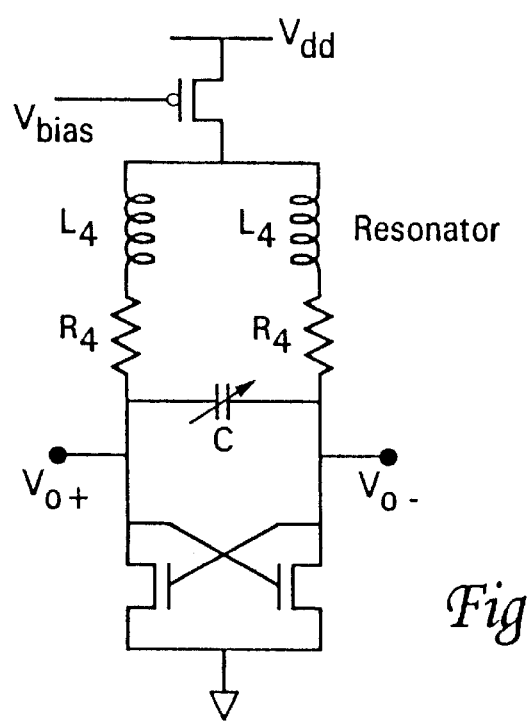
FIG. 5B illustrates the circuit diagram equivalent to the partially schematic circuit diagram of FIG. 5A.

Refer now to FIG. 5B. FIG. 5B illustrates the circuit diagram equivalent to the partially schematic circuit diagram of FIG. 5A. Shown is that the resulting circuit diagram is essentially the same as that of the FIG. 2, but with the inductors of the circuit diagram shown FIG. 2 replaced with the resulting equivalent circuit shown for outer coil 402 in FIG. 4D.

While the invention has been shown and described with reference to particular embodiments thereof, it will be understood by those skilled in the art that the foregoing and other changes in form and detail may be made therein without departing from the spirit and scope of the invention, which is defined only by the following claims.

I claim:

1. An integrated circuit comprising:
   a substrate; and
   a composite inductor having at least a first coil with an associated first coil inductance and first coil resistance and a second coil with an associated second coil inductance and second coil resistance, with the first coil and the second coil formed in said substrate such that when a current in the first coil is matched with a current in the second coil, a new inductance associated with the first coil is produced that is in excess of the first coil inductance.

2. The integrated circuit of claim 1, wherein said composite inductor further includes, when the current in the first coil is matched with the current in the second coil, a new resistance associated with the first coil which is substantially the same as or less than the first coil resistance.

3. The integrated circuit of claim 1, wherein the first coil further includes an outer spiral coil formed in said substrate.

4. The integrated circuit of claim 3, wherein the second coil further includes an inner spiral coil formed in said substrate such that said inner spiral coil is formed in parallel with and is encompassed within said outer spiral coil and such that a magnetic flux of said outer spiral coil will link to a magnetic flux of said inner spiral coil.

5. The integrated circuit of claim 4, further comprising:
   a first electrical power source, electrically connected to said outer spiral coil, which produces a current in said outer spiral coil; and
   a second electrical power source, electrically connected to said inner spiral coil, which produces a current within said inner spiral coil which mirrors the current produced in said outer spiral coil by said first electrical power source.

6. The integrated circuit of claim 5, further comprising a quadrature current generating electrical power source from which said first and said second electrical power sources may be derived.

7. An oscillator implemented in an integrated circuit, said oscillator comprising:
   a substrate;
   a composite inductor having at least a first coil with an associated first coil inductance and first coil resistance and a second coil with an associated second coil inductance and second coil resistance, with the first coil and the second coil formed in said substrate such that when a current in the first coil is matched with a current in the second coil, a new inductance associated with the first coil is produced that is in excess of the first coil inductance; and
   at least one capacitor formed in said substrate such that said at least one capacitor is in electrical connection with the first coil of said composite inductor and such that an electronic oscillator is formed.

8. The oscillator of claim 7, wherein said composite inductor further includes, when the current in the first coil is matched with the current in the second coil, a new resistance associated with the first coil which is substantially the same as or less than the first coil resistance.

9. The oscillator of claim 7, wherein said first coil further includes an outer spiral coil formed in said substrate.

10. The oscillator of claim 9, wherein said second coil further includes an inner spiral coil formed in said substrate such that said inner spiral coil is formed in physical parallel with and is encompassed within said outer spiral coil and such that a magnetic flux of said outer spiral coil will link to a magnetic flux of said inner spiral coil.

11. The oscillator of claim 10, further comprising:
   a first electrical power source, electrically connected to said outer spiral coil, which produces a current in said outer spiral coil; and
   a second electrical power source, electrically connected to said inner spiral coil, which produces a current within said inner spiral coil which mirrors the current produced in said outer spiral coil by said first electrical power source.

12. The oscillator of claim 11, further comprising a quadrature current generating electrical power source from which said first and said second electrical power sources may be derived.

13. A method for forming in an integrated circuit substrate a first coil having an associated first coil inductance and first coil resistance and a second coil having an associated second coil inductance and second coil resistance such that a new inductance associated with the first coil is produced which is substantially greater than the first coil inductance and such that a new resistance associated with the first coil is produced which is substantially the same as or less than the first coil resistance, said method comprising steps of:
   forming a first coil in the integrated circuit substrate;
   forming a second coil in the integrated substrate such that said second coil is proximate to said first coil and such that a magnetic flux from said formed first coil will link with a magnetic flux of said formed second coil;
   connecting a first electrical power source to the first coil;
   connecting a second electrical power source to the second coil; and
   energizing said first and second electrical power sources such that the currents in the first and second coils are matched.

14. The method of claim 13, wherein said step of forming the first coil further includes the step of forming an outer spiral coil.

15. The method of claim 14, wherein said step of forming the second coil proximate to said first coil further includes the step of forming an inner spiral coil in parallel with and encompassed within the outer spiral coil.

16. The method of claim 15, further comprising the steps of:
   connecting electrically at least one capacitor to the outer coil;
   connecting an electrical source as input to the at least one capacitor in electrical connection with the outer coil such that an oscillator can be formed.

17. The method of claim 16, wherein said step of connecting further includes the step of forming a tuned oscillator.

* * * * *